United States Patent
Lin et al.

(10) Patent No.: US 11,379,062 B2
(45) Date of Patent: Jul. 5, 2022

(54) DISPLAY PANEL AND TESTING METHOD THEREOF

(71) Applicant: Wuhan China Star Optoelectronics Semiconductor Display Technology Co., Ltd., Wuhan (CN)

(72) Inventors: Dan Lin, Wuhan (CN); Qibing Dai, Wuhan (CN); Minlun Liu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 148 days.

(21) Appl. No.: 16/955,047

(22) PCT Filed: Dec. 30, 2019

(86) PCT No.: PCT/CN2019/129892
§ 371 (c)(1),
(2) Date: Jun. 18, 2020

(87) PCT Pub. No.: WO2021/120323
PCT Pub. Date: Jun. 24, 2021

(65) Prior Publication Data
US 2022/0137732 A1  May 5, 2022

(30) Foreign Application Priority Data

Dec. 18, 2019 (CN) .......................... 201911307776.7

(51) Int. Cl.
*G06F 3/041* (2006.01)
*H01L 27/32* (2006.01)

(52) U.S. Cl.
CPC ............ *G06F 3/041* (2013.01); *H01L 27/323* (2013.01); *H01L 27/3244* (2013.01)

(58) Field of Classification Search
CPC .... G06F 3/0446; G06F 3/0412; G06F 3/0445; G06F 3/044; G06F 3/0443;
(Continued)

(56) References Cited

U.S. PATENT DOCUMENTS 4,874,086 A * 10/1989 Imamura ........... H01L 23/49572
257/676
2003/0032263 A1 * 2/2003 Nagao ..................... H01L 22/32
438/18
(Continued)

FOREIGN PATENT DOCUMENTS

| CN | 102193010 | 9/2011 |
|---|---|---|
| CN | 103069369 | 4/2013 |

(Continued)

*Primary Examiner* — Dong Hui Liang

(57) ABSTRACT

A display panel and a testing method thereof, the display panel including a product region and a cutting region, and the product region including a display sub-region and a non-display sub-region. The display panel includes a flexible substrate, a thin film transistor layer, an organic light-emitting layer, a encapsulation layer, and a touch layer. The touch layer includes touch electrodes and touch leads. An end of each of the touch leads is connected to a corresponding touch electrode, the other end of each of the touch leads extends from the non-display sub-region to the cutting region, and a density of the touch leads in the cutting region is less than a density of the touch leads in the non-display sub-region.

9 Claims, 4 Drawing Sheets

(58) Field of Classification Search
CPC .... G06F 3/04164; G06F 3/041; G06F 3/0448; G06F 2203/04103; G06F 2203/04112; G06F 2203/04104; H01L 24/48; H01L 24/06; H01L 2224/73265; H01L 25/0657; H01L 23/49811
See application file for complete search history.

(56) References Cited

U.S. PATENT DOCUMENTS

| | | | | |
|---|---|---|---|---|
| 2005/0212147 | A1* | 9/2005 | Nishizawa | H01L 22/32 257/786 |
| 2007/0132080 | A1* | 6/2007 | Nakashima | H01L 25/0657 257/E23.126 |
| 2012/0038613 | A1* | 2/2012 | Choi | G09G 3/20 345/211 |
| 2013/0050226 | A1 | 2/2013 | Shenoy et al. | |
| 2016/0062536 | A1 | 3/2016 | Choi et al. | |
| 2021/0026182 | A1* | 1/2021 | Yu | H05K 3/0052 |
| 2021/0181916 | A1* | 6/2021 | Kwon | H01L 27/323 |

FOREIGN PATENT DOCUMENTS

| | | |
|---|---|---|
| CN | 103761019 | 4/2014 |
| CN | 104049790 | 9/2014 |
| CN | 104238823 | 12/2014 |
| CN | 104765169 | 7/2015 |
| CN | 104820528 | 8/2015 |
| CN | 106775173 | 5/2017 |
| CN | 108550552 | 9/2018 |
| CN | 108845702 | 11/2018 |
| CN | 109064903 | 12/2018 |
| CN | 109614012 | 4/2019 |
| CN | 109659277 | 4/2019 |
| JP | 2016-103283 | 6/2016 |

* cited by examiner

DISPLAY PANEL AND TESTING METHOD THEREOF

RELATED APPLICATIONS

This application is a National Phase of PCT Patent Application No. PCT/CN2019/129892 having International filing date of Dec. 30, 2019, which claims the benefit of priority of Chinese Patent Application No. 201911307776.7 filed on Dec. 18, 2019. The contents of the above applications are all incorporated by reference as if fully set forth herein in their entirety.

FIELD AND BACKGROUND OF THE INVENTION

The present application relates to the technical field of display panels, and in particular, to a display panel and a testing method thereof.

Active-matrix organic light-emitting diode (AMOLED) display panels are one of the hotspots in the field of display device research. Compared with liquid crystal display devices, organic light-emitting diodes (OLEDs) have excellent performances, such as rich color gamut, wide viewing angles, thin thickness, fast response times, and flexibility. Touch screens can realize human-machine communication more intuitively and concisely, and achieve a good user experience. In order to improve the competitiveness of products, touch technology and OLED display technology will be integrated to form an OLED display panel with touch function, which will increase the product's differentiated design, save costs, and maximize profits.

Technical Problem

One conventional manufacturing method of the integrated touch display panel is first to batch produce multiple display panels on a mother board, and then roughly cutting the mother board into multiple sub-boards (each sub-board corresponding to a display panel). The display panel includes a product region and a cutting region arranged around the product region. The product region includes a display sub-region and a non-display sub-region. In this manufacturing process, because both display traces and touch leads are integrated on the non-display sub-region of the display panel, a spacing between the touch leads in the non-display sub-region is small. Therefore, it is impossible to perform a connection test with the touch traces in the non-display sub-region without bonding a chip (IC) due to the alignment accuracy problem.

SUMMARY OF THE INVENTION

Technical Solutions

The embodiments of the present application provide a display panel and a testing method thereof to solve the problem in the manufacturing process of the conventional display panel. Because both display traces and touch leads are integrated on the non-display sub-region of the display panel, a spacing between the touch leads in the non-display sub-region is small. Therefore, it is impossible to perform a connection test with the touch traces in the non-display sub-region without bonding a chip (IC) due to the alignment accuracy problem.

An embodiment of the present application provides a display panel including a product region and a cutting region disposed outside the product region, the product region including a display sub-region and a non-display sub-region, wherein the display panel includes:

a flexible substrate;

a thin film transistor layer disposed on a side of the flexible substrate and corresponding to the display sub-region;

an organic light-emitting layer disposed on a side of the thin film transistor layer away from the flexible substrate and corresponding to the display sub-region;

an encapsulation layer disposed on a side of the organic light-emitting layer away from the thin film transistor and at least corresponding to the product region; and a touch layer disposed on a side of the encapsulation layer away from the organic light-emitting layer, wherein the touch layer includes a plurality of touch electrodes and a plurality of touch leads, the touch electrodes are disposed corresponding to the display sub-region, an end of each of the touch leads is connected to a corresponding touch electrode, the other end of each of the touch leads extends from the non-display sub-region to the cutting region, and a density of the touch leads in the cutting region is less than a density of the touch leads in the non-display sub-region.

In the display panel of an embodiment according to the present application, at least one testing pad group connected to the touch leads is disposed in the cutting region.

In the display panel of an embodiment according to the present application, the cutting region is disposed around a periphery of the product region, and the testing pad group is disposed in the cutting region at a side of the non-display sub-region away from the display sub-region.

In the display panel of an embodiment according to the present application, the cutting region is in a C-shape arranged from an upper side to a lower side of the product region and a side of the product region close to the display sub-region, the testing pad group includes a first sub-pad group and a second sub-pad group, and the first sub-pad group and the second sub-pad group are respectively positioned on the upper and lower sides of the non-display sub-region in the cutting region.

In the display panel of an embodiment according to the present application, an insulating layer is disposed between the flexible substrate and the touch leads and positioned in the non-display sub-region and the cutting region, the insulating layer is provided with a plurality of first via holes defined in the cutting region and a plurality of second via holes defined in the non-display sub-region, and the touch leads in the cutting region passing through the first via holes are connected to the touch leads passing through the second via holes in the non-display sub-region.

In the display panel of an embodiment according to the present application, a distance between centerlines of any two adjacent touch leads in the cutting region is greater than or equal to 180 um.

In the display panel of an embodiment according to the present application, a distance between centerlines of any two adjacent touch leads in the non-display sub-region is less than or equal to 40 um.

The embodiment of the present application further provides a method of testing a display panel as described above, including:

testing the touch electrodes through touch leads in the cutting region; and wherein after the testing is completed, a portion of the display panel corresponding to the cutting region is removed to obtain a portion of the display panel corresponding to the product region.

In the testing method of the display panel of an embodiment according to the present application, the step of testing the touch electrodes through touch leads in the cutting region includes:

connecting a touch electrode test board to the touch leads in the cutting region by a simulate bonding method; and inputting test signals to the touch leads in the cutting region through the touch electrode test board to test the touch electrodes.

In the testing method of the display panel of an embodiment according to the present application, the portion of the display panel corresponding to the cutting region is removed by a cutter wheel cutting or a laser cutting.

Beneficial Effect

By extending the touch leads from the non-display sub-region to the cutting region, and making the density of the touch leads in the cutting region less than the density of the touch leads in the non-display sub-region, so that an external test circuit and the touch leads in the cutting region can be accurately aligned, and various performance tests can be conveniently carried out on the touch electrodes before the display panel is bound with the IC. The detection efficiency is improved, and in addition, the cutting region of the display panel in the manufacturing process is fully and reasonably used, and after the test is completed, the cutting region can be removed for subsequent production.

BRIEF DESCRIPTION OF THE SEVERAL VIEWS OF THE DRAWINGS

The following detailed description of specific embodiments of the present application will make the technical solutions and other beneficial effects of the present application obvious in conjunction with the accompanying drawings.

DESCRIPTION OF SPECIFIC EMBODIMENTS OF THE INVENTION

Figure 1:
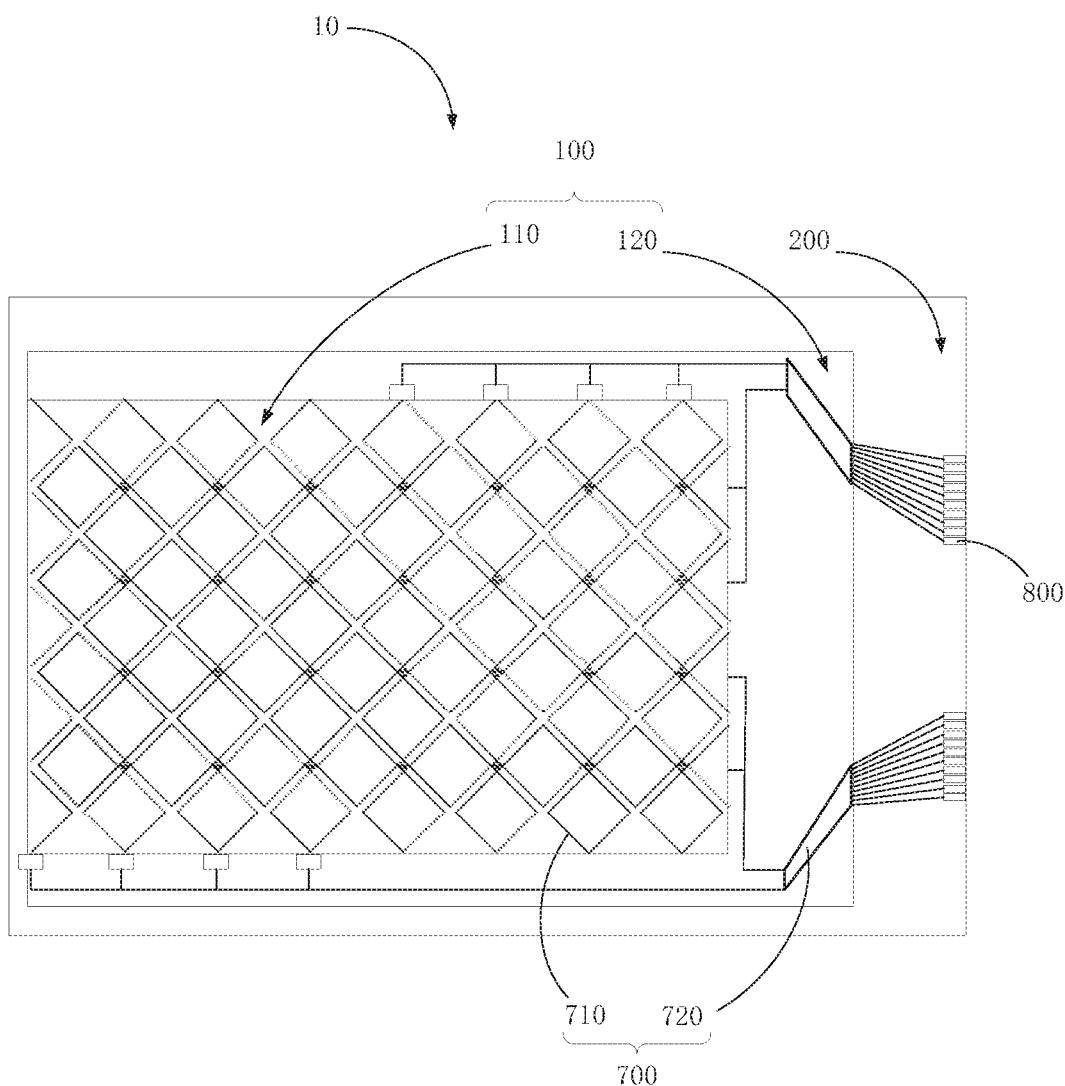
FIG. 1 is a schematic plane structural view of a display panel according to an embodiment of the present application.

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise.

In the description of this application, it should be noted that the terms "installation", "connected", and "coupled" should be understood in a broad sense, unless explicitly stated and limited otherwise. For example, they may be fixed connections, removable connected or integrally connected; it can be mechanical, electrical, or can communicate with each other; it can be directly connected, or it can be indirectly connected through an intermediate medium, it can be an internal communication of two elements or an interaction relationship of two elements. For those of ordinary skill in the art, the specific meanings of the above terms in this application can be understood according to specific situations.

In the present invention, the first feature "on" or "under" the second feature can include direct contact of the first and second features, and can also be included that the first and second features are not in direct contact but are contacted by additional features between them, unless otherwise specifically defined and defined. Moreover, the first feature is "above", "on", and "on the top of" of the second feature, including the first feature directly above and diagonally above the second feature, or simply means that the first feature is horizontally higher than the second feature. The first feature is "under", "below", and "beneath" the second feature, including the first feature directly below and diagonally below the second feature, or merely the first feature is horizontally less than the second feature.

The following disclosure provides many different implementations or examples for implementing different structures of the present application. To simplify the disclosure of the present application, the components and settings of specific examples are described below. Of course, they are merely examples and are not intended to limit the application. Furthermore, the present application may repeat reference numbers and/or reference letters in different examples, and such repetition is for the sake of simplicity and clarity, and does not by itself indicate a relationship between the various embodiments and/or settings discussed. In addition, examples of various specific processes and materials are provided in this application, but those of ordinary skill in the art can be aware of the application of other processes and/or the use of other materials.

The present application is further described below with reference to the drawings and embodiments.

As shown in FIG. 1, an embodiment of the present application provides a display panel 10 including a product region 100 and a cutting region 200 disposed outside the product region 100. The product region 100 includes a display sub-region 110 and a non-display sub-region 120. It can be understood that the non-display sub-region 120 includes a bonding region of the display panel 10, and in the conventional integrated touch display panel structure, the non-display sub-region 120 is integrated with display lines and touch leads, which results in dense the touch leads in the non-display sub-region 120 (especially the bonding region). This leads to the problem that the touch traces in the non-display sub-region cannot be tested before a chip (IC) is bonded due to the alignment accuracy problem.

Figure 3:
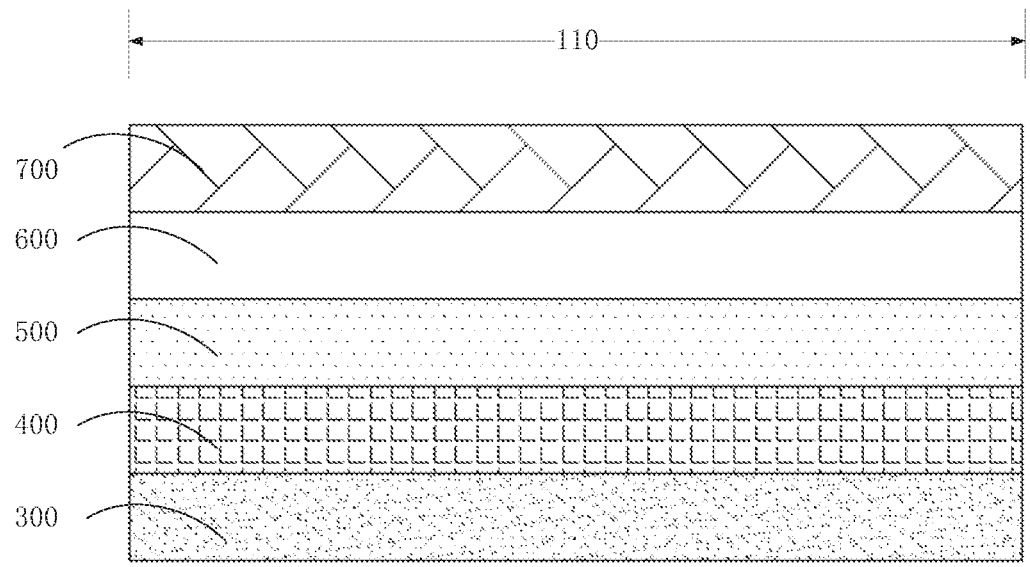
FIG. 3 is a schematic diagram of a hierarchical structure in a display sub-region of the display panel according to an embodiment of the present application.

As shown in FIG. 3, the display panel 10 includes a flexible substrate 300, a thin film transistor layer 400, an organic light-emitting layer 500, an encapsulation layer 600, and a touch layer 700. The thin film transistor layer 400 is disposed on a side of the flexible substrate 300 and corresponding to the display sub-region 110. The organic light-emitting layer 500 is disposed on a side of the thin film transistor layer 400 away from the flexible substrate 300 and corresponding to the display sub-region 110. The encapsulation layer 600 is disposed on a side of the organic light-emitting layer 500 away from the thin film transistor and at least corresponding to the product region 100. The touch layer 700 is disposed on a side of the encapsulation layer 600 away from the organic light-emitting layer 500. The touch layer 700 includes a plurality of touch electrodes 710 and a plurality of touch leads 720. The touch electrodes 710 are disposed corresponding to the display sub-region 110. An end of each of the touch leads 720 is connected to a corresponding touch electrode 710, the other end of each of the touch leads 720 extends from the non-display sub-region 120 to the cutting region 200, and a density of the touch leads 720 in the cutting region 200 is less than a density of the touch leads 720 in the non-display sub-region 120.

It can be understood that the touch leads 720 are extended from the non-display sub-region 120 to the cutting region 200 so that make full use of the space of the cutting region 200. Obviously, the cutting region 200 of the display panel 10 is a part of the display panel 10 positioned outside the product region 100 after dividing a mother board prepared with a plurality of display panels 10 when the display panels 10 are manufactured in batches. Moreover, in an embodiment, the density of the touch leads 720 in the cutting region 200 is less than the density of the touch leads 720 in the non-display sub-region 120. Specifically, a distance between centerlines of any two adjacent touch leads 720 in the cutting region 200 is greater than or equal to 180 um, and a distance between centerlines of any two adjacent touch leads 720 in the non-display sub-region 120 is less than or equal to 40 um.

It is obvious that by extending the dense touch leads 720 in the non-display sub-region 120 to the cutting region 200 and reducing the density of the touch leads 720 positioned in the cutting region 200 so that an external measurement circuit can be accurately aligned with the touch leads 720 in the cutting region 200, thereby facilitating the external measurement circuit connected to the touch electrodes 710 through the touch leads 720 in the cutting region 200 to achieve the testing of the touch electrodes 710. Specifically, through a touch electrode 710 test board provided with a test circuit, and the touch electrode 710 test board can be in the form of a flexible circuit board or other forms. After the test is completed, a part of the display panel 10 corresponding to the cutting region 200 is cut and removed in order to complete the subsequent panel manufacturing process. Obviously, by using such a structure and a testing method, it is possible to realize accurately connection and testing of the touch leads 720 in the display panel 10 production process, also to make good use of the control of the cutting region 200. After the test, a part of the cutting region 200 is cut without affecting the subsequent process, an entire process has a stable and efficient test result.

Figure 2:
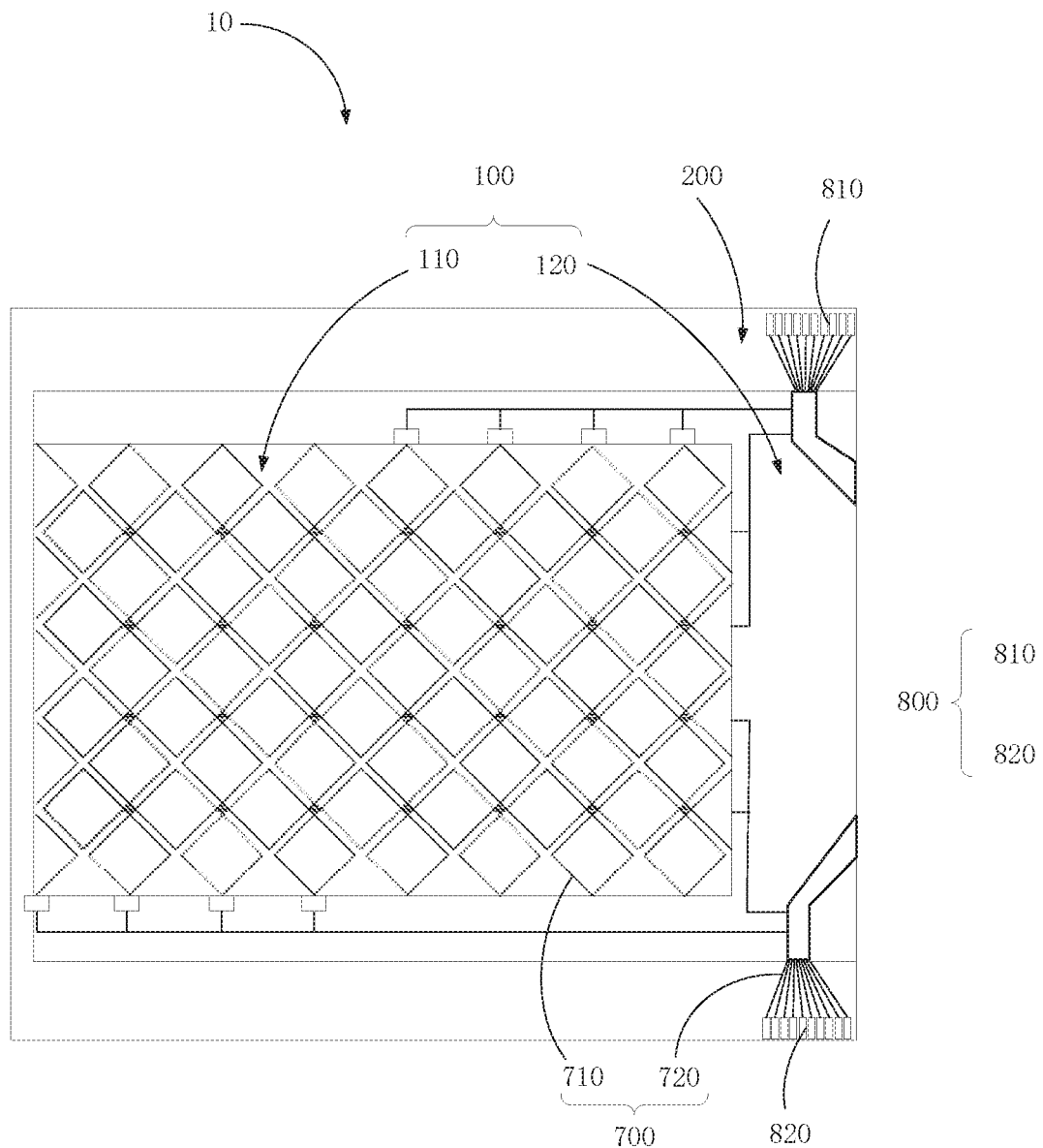
FIG. 2 is a schematic plane structural view of another display panel according to an embodiment of the present application.

In an embodiment, a testing pad group 800 connected to the touch leads 720 is provided in the cutting region 200. Obviously, the testing pad group 800 can more accurately aligned with the external test circuit. It is understood that in the process of manufacturing the display panel 10 in batches, the mother board prepared with the display panels 10 is being to cut, the testing pad group 800 can be arranged according to the position of the cutting region 200 in the specific display panel 10, as shown in FIG. 1. When the cutting region 200 is arranged around the product region 100, the testing pad group 800 is centrally disposed on the cutting region 200 at a side of the non-display sub-region 120 away from the display sub-region 110. As shown in FIG. 2, when the cutting region 200 is in a C-shape arranged around from an upper side to a lower side of the product region 100 and a side of the product region 100 close the display sub-region 110. The testing pad group 800 includes a first sub-pad group 810 and a second sub-pad group 820, and the first sub-pad group 810 and the second sub-pad group 820 are respectively disposed in the cutting region 200 on the upper and lower sides of the non-display sub-region 120. Obviously, the testing pad group 800 is centrally disposed at the side of the non-display sub-region 120 away from the display sub-region 110, which is more convenient to aligned with the external test circuit. And, the testing pad group 800 is divided into the first sub-pad group 810 and the second sub-pad group 820 respectively positioned in the cutting region 200 at the upper and lower sides of the non-display sub-region 120, which is more convenient for cutting the mother board prepared with the multiple display panels 10. When the mother board is specifically cut, as shown in FIG. 2, a portion of the display panel 10 positioned at the side of the non-display sub-region away from the display sub-region 110 can be completely removed, so as to reduce the subsequent process for removing the cutting region 200.

Figure 4:
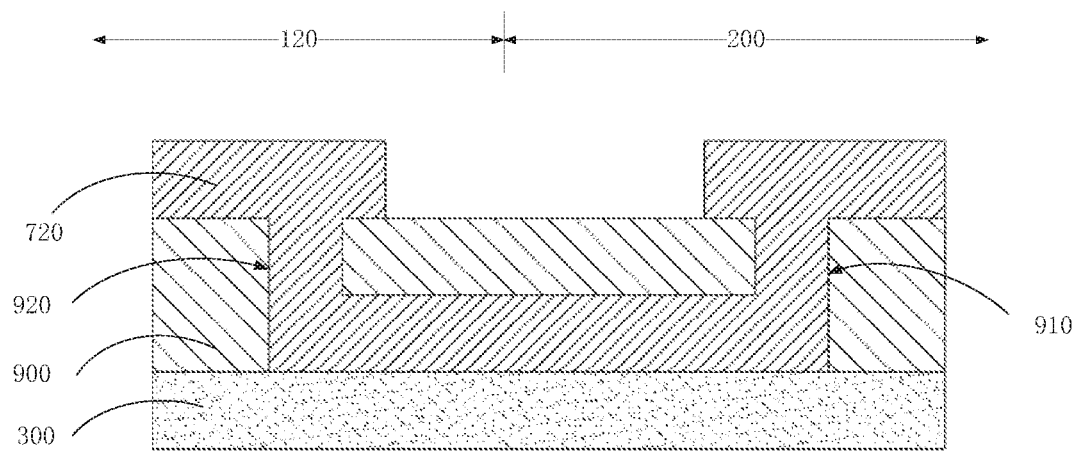
FIG. 4 is a partial structural schematic diagram of a layer-change bridge of touch leads in the display panel according to an embodiment of the present application.

In an embodiment, as shown in FIG. 4, an insulating layer 900 is disposed between the flexible substrate 300 and the touch leads 720 and positioned in the non-display sub-region 120 and the cutting region 200. The insulating layer 900 is provided with a plurality of first via holes 910 defined in the cutting region 200 and a plurality of second via holes 920 defined in the non-display sub-region 120. The touch leads 720 in the cutting region 200 passing through the first via holes 910 are connected to the touch leads 720 passing through the second via holes 920 in the non-display sub-region 120. It can be understood that the first via holes 910 and the second via holes 920 are convenient for a layer-change bridge of touch leads in the cutting region 200 and the touch leads 720 in the non-display sub-region 120, so as to prevent the touch leads from short-circuit in the process of cutting the portion of the display panel 10 corresponding to the cutting region 200.

In summary, by extending the touch leads 720 from the non-display sub-region 120 to the cutting region 200, and making the density of the touch leads 720 in the cutting region 200 less than the density of the touch leads 720 in the non-display sub-region 120, so that an external test circuit and the touch leads 720 in the cutting region 200 can be accurately aligned, and various performance tests can be conveniently carried out on the touch electrodes 710 before the display panel 10 is bound with the IC. The detection efficiency is improved, and in addition, the setting position of the testing pad group 800 described in the present application is more flexible, can be set according to the position of the actual cutting region 200, and the arrangement of layer-change bridge is adopted between touch leads 720 in the cutting region 200 and in the non-display sub-region 120, so as to prevent from short-circuit in the process of cutting the portion of the display panel 10 corresponding to the cutting region 200.

Figure 5:
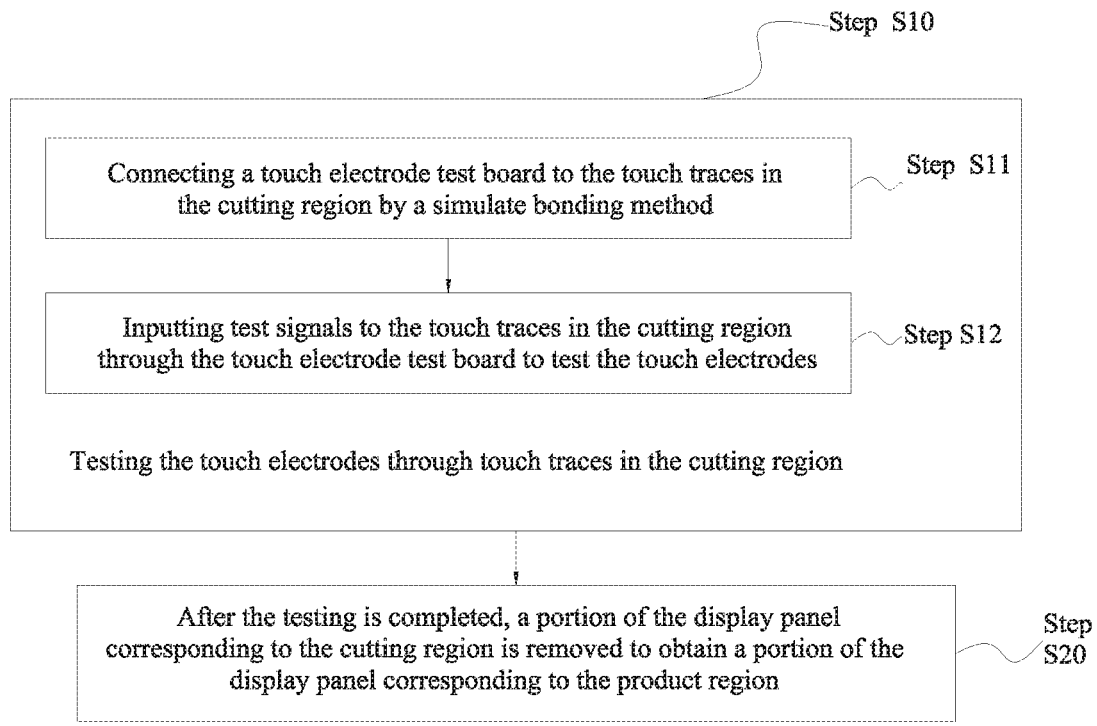
FIG. 5 is a schematic flowchart of a testing method of a display panel according to an embodiment of the present application.

An embodiment of the present application further provides a testing method of the display panel 10 as described above, as shown in FIG. 5, including:

step S10, testing the touch electrodes 710 through touch leads 720 in the cutting region 200; and step S20, wherein after the testing is completed, a portion of the display panel 10 corresponding to the cutting region 200 is removed to obtain a portion of the display panel 10 corresponding to the product region 100. Specifically, the portion of the display panel 10 corresponding to the cutting region 200 is removed by a cutter wheel cutting or a laser cutting.

In the display panel of the embodiment of the present application, the step S10 of testing the touch electrodes 710 through touch leads 720 in the cutting region 200 includes:

step S11, connecting a touch electrode 710 test board to the touch leads 720 in the cutting region 720 by a simulate bonding method; and step S12, inputting test signals to the touch leads 720 in the cutting region 200 through the touch electrode 710 test board to test the touch electrodes 710. Specifically, the content of testing the touch electrodes 710 can include: whether the touch electrode 710 has a short circuit, an open circuit, or the like, or not.

It can be understood that, step S20, after the test is completed, a portion of the display panel 10 corresponding to the cutting region 200 is removed to obtain a portion of the display panel 10 corresponding to the product region 100. Meanwhile, after the test is completed, that is after the indicators of the touch electrode 710 pass the test, of course, it also includes that the touch electrode 710 is reworked after the test fails. Then after testing the various indicators, the portion of the display panel 10 corresponding to the cutting region 200 is cut away to obtain the portion of the display panel 10 corresponding to the product region 100. Of course, the various test indicators of the touch electrodes 710 and whether they are qualified can be set according to specific product requirements.

In summary, the testing method of the display panel 10 of the present application makes full use of the portion of the cutting region 200 of the display panel 10 in the batch production of the display panel 10, which is convenient for performing various performance tests of the touch electrodes 710 before the IC is bound to the display panel 10. Moreover, it does not affect the fabrication of other processes, and has high practicability and adaptability.

In summary, the present application by extending the touch leads 720 from the non-display sub-region 120 to the cutting region 200, and making the density of the touch leads 720 in the cutting region 200 less than the density of the touch leads 720 in the non-display sub-region 120, so that an external test circuit and the touch leads 720 in the cutting region 200 can be accurately aligned, and various performance tests can be conveniently carried out on the touch electrodes 710 before the display panel 10 is bound with the IC. The detection efficiency is improved, and in addition, the cutting region 200 of the display panel 10 in the manufacturing process is fully and reasonably used, and after the test is completed, the cutting region 200 can be removed for subsequent production.

It can be understood that for a person of ordinary skill in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising a product region and a cutting region disposed outside the product region, the product region comprising a display sub-region and a non-display sub-region, wherein the display panel comprises:
    a flexible substrate;
    a thin film transistor layer disposed on a side of the flexible substrate and corresponding to the display sub-region;
    an organic light-emitting layer disposed on a side of the thin film transistor layer away from the flexible substrate and corresponding to the display sub-region;
    an encapsulation layer disposed on a side of the organic light-emitting layer away from the thin film transistor and at least corresponding to the product region; and
    a touch layer disposed on a side of the encapsulation layer away from the organic light-emitting layer, wherein the touch layer comprises a plurality of touch electrodes and a plurality of touch leads, the touch electrodes are disposed corresponding to the display sub-region, an end of each of the touch leads is connected to a corresponding touch electrode, the other end of each of the touch leads extends from the non-display sub-region to the cutting region, and a density of the touch leads in the cutting region is less than a density of the touch leads in the non-display sub-region, and
    wherein an insulating layer is disposed between the flexible substrate and the touch leads and positioned in the non-display sub-region and the cutting region, the insulating layer is provided with a plurality of first via holes defined in the cutting region and a plurality of second via holes defined in the non-display sub-region, and the touch leads in the cutting region passing through the first via holes are connected to the touch leads passing through the second via holes in the non-display sub-region.

2. The display panel according to claim 1, wherein at least one testing pad group connected to the touch leads is disposed in the cutting region.

3. The display panel according to claim 2, wherein the cutting region is disposed around a periphery of the product region, and the testing pad group is disposed in the cutting region at a side of the non-display sub-region away from the display sub-region.

4. The display panel according to claim 2, wherein the cutting region is in a C-shape arranged from an upper side to a lower side of the product region and a side of the product region close to the display sub-region, the testing pad group comprises a first sub-pad group and a second sub-pad group, and the first sub-pad group and the second sub-pad group are respectively positioned on the upper and lower sides of the non-display sub-region in the cutting region.

5. A testing method of a display panel according to claim 1, comprising:
    testing the touch electrodes through touch leads in the cutting region; and wherein after the testing is completed, a portion of the display panel corresponding to the cutting region is removed to obtain a portion of the display panel corresponding to the product region.

6. The testing method of the display panel according to claim 5, wherein the step of testing the touch electrodes through touch leads in the cutting region comprises:
   connecting a touch electrode test board to the touch leads in the cutting region by a simulate bonding method; and
   inputting test signals to the touch leads in the cutting region through the touch electrode test board to test the touch electrodes.

7. The testing method of the display panel according to claim 5, wherein the portion of the display panel corresponding to the cutting region is removed by a cutter wheel cutting or a laser cutting.

8. The display panel according to claim 1, wherein a distance between centerlines of any two adjacent touch leads in the cutting region is greater than or equal to 180 um.

9. The display panel according to claim 8, wherein a distance between centerlines of any two adjacent touch leads in the non-display sub-region is less than or equal to 40 um.

* * * * *